United States Patent [19]
Aoki et al.

[11] Patent Number: 6,002,731
[45] Date of Patent: Dec. 14, 1999

[54] RECEIVED-DATA BIT SYNCHRONIZATION CIRCUIT

[75] Inventors: Yasushi Aoki; Mitsuo Baba, both of Tokyo, Japan

[73] Assignee: NEC Corporation, Tokyo, Japan

[21] Appl. No.: 08/995,345

[22] Filed: Dec. 22, 1997

[30] Foreign Application Priority Data

Dec. 25, 1996 [JP] Japan ................................. 8-344355

[51] Int. Cl.⁶ ........................................................ H04L 7/00
[52] U.S. Cl. ......................... 375/371; 327/107; 327/144
[58] Field of Search ................................. 375/371, 354, 375/355, 362, 375; 372/107, 144

[56] References Cited

U.S. PATENT DOCUMENTS

| | | | |
|---|---|---|---|
| 4,996,444 | 2/1991 | Thomas et al. | 307/269 |
| 5,138,633 | 8/1992 | Cortese | 375/106 |
| 5,341,405 | 8/1994 | Mallard, Jr. | 375/120 |
| 5,608,357 | 3/1997 | Ta et al. | 331/57 |
| 5,712,580 | 1/1998 | Baumgartner et al. | 327/12 |
| 5,757,857 | 5/1998 | Buchwald | 375/271 |

FOREIGN PATENT DOCUMENTS

| | | |
|---|---|---|
| 61-127243 | 6/1986 | Japan . |
| 62-43919 | 2/1987 | Japan . |
| 4-319829 | 11/1992 | Japan . |
| 5-91096 | 4/1993 | Japan . |
| 8-237117 | 9/1996 | Japan . |
| 9-233061 | 9/1997 | Japan . |

*Primary Examiner*—Stephen Chin
*Assistant Examiner*—Mohammad Ghayour
*Attorney, Agent, or Firm*—Scully, Scott, Murphy & Presser

[57] ABSTRACT

In a data synchronization circuit for obtaining a clock synchronized with bits of received data to submit the received data to retiming, it is achieved that a phase synchronization without use of a feedback loop configuration giving rise to oscillations is performed. The received data are devided according to the frequency in a frequency dividing circuit. This frequency divided output and the respective n-phase clocks are compared in phase to generate a specific signal to specify one of n-phase clocks having predetermined phase relations to the frequency divided output. While, on the other hand, the change points of the frequency divided output are synchronized with the extracted clock of a clock selector to average the specific signal with the timing of this change point synchronization signal. One of n-phase clocks is extracted in conformity with the state of this averaged output to make an extracted clock and to subject the received data to retiming in a flip-flop by using this clock.

9 Claims, 13 Drawing Sheets

FIG. 9

| LATCH OUTPUT | | | | | | | | PHASE COMPARISON SIGNAL 14 | 8-PHASE CLOCK |
|---|---|---|---|---|---|---|---|---|---|
| 42-1 | 42-2 | 42-3 | 42-4 | 42-5 | 42-6 | 42-7 | 42-8 | | |
| 1 | 1 | 1 | 1 | 0 | 0 | 0 | 0 | 0 (0 0 0) | 12-1 |
| 0 | 1 | 1 | 1 | 1 | 0 | 0 | 0 | 1 (0 0 1) | 12-2 |
| 0 | 0 | 1 | 1 | 1 | 1 | 0 | 0 | 2 (0 1 0) | 12-3 |
| 0 | 0 | 0 | 1 | 1 | 1 | 1 | 0 | 3 (0 1 1) | 12-4 |
| 0 | 0 | 0 | 0 | 1 | 1 | 1 | 1 | −4 (1 0 0) | 12-5 |
| 1 | 0 | 0 | 0 | 0 | 1 | 1 | 1 | −3 (1 0 1) | 12-6 |
| 1 | 1 | 0 | 0 | 0 | 0 | 1 | 1 | −2 (1 1 0) | 12-7 |
| 1 | 1 | 1 | 0 | 0 | 0 | 0 | 1 | −1 (1 1 1) | 12-8 |

FIG.11

| NUMERICAL VALUE OPERATION SECTION INPUT 28 | NUMERICAL VALUE OPERATION SECTION OUTPUT 29-1 TO 29-8 | | | | | | | |
|---|---|---|---|---|---|---|---|---|
| | 29-1 | 29-2 | 29-3 | 29-4 | 29-5 | 29-6 | 29-7 | 29-8 |
| $-0.5 \sim +0.5$ | 1 | 0 | 0 | 0 | 0 | 0 | 0 | 0 |
| $+0.5 \sim +1.5$ | 0 | 1 | 0 | 0 | 0 | 0 | 0 | 0 |
| $+1.5 \sim +2.5$ | 0 | 0 | 1 | 0 | 0 | 0 | 0 | 0 |
| $+2.5 \sim +3.5$ | 0 | 0 | 0 | 1 | 0 | 0 | 0 | 0 |
| $-4.5 \sim -3.5$ | 0 | 0 | 0 | 0 | 1 | 0 | 0 | 0 |
| $-3.5 \sim -2.5$ | 0 | 0 | 0 | 0 | 0 | 1 | 0 | 0 |
| $-2.5 \sim -1.5$ | 0 | 0 | 0 | 0 | 0 | 0 | 1 | 0 |
| $-1.5 \sim -0.5$ | 0 | 0 | 0 | 0 | 0 | 0 | 0 | 1 |

RECEIVED-DATA BIT SYNCHRONIZATION CIRCUIT

BACKGROUND OF THE INVENTION

1. Field of the invention

The present invention relates to a data synchronization circuit and particularly to a data synchronization circuit wherein a phase synchronization is obtained using a clock synchronized with a bit of the relevant received data.

2. Description of the Prior Art

In a digital transmission apparatus, one of the techniques for extracting and reproducing a transmitted digital signal on the receiving side is a bit synchronization technique. In a digital transmission apparatus or the like, it is required to receive a digital signal having a phase variation without errors.

Generally, as one example of bit synchronization circuit used in the transmission of digital signals between a plurality of apparatus operating with a clock supplied from one and the same clock source (synchronized in frequency), "PLL Circuit by Polyphase Clock" described in Japanese Patent Laid-Open No. 43919/1987 is known.

FIG. 14 is a block diagram showing a conventional bit synchronization circuit. In FIG. 14, n-phase clocks 12-1 to 12-n are applied via input clock terminals 2-1 to 2-n to the clock selector 47, which have the same frequency as that of the received data signal and phases different by 360/n (n: integer equal to or greater than 2). This clock selector 47 selects the clock corresponding to a count value of the up-down counter 46 from the n-phase clocks and outputs it to the output clock terminal 9 as an extracted clock 48.

Next, operations will be described. The phase comparison circuit 45 compares the phase of a received data signal 11 inputted via the input data terminal 1 and that of the extracted clock 48. In accordance with the result of phase comparison, the up-down counter 46 performs an increment and decrement in the count value to perform a selective control of the clock selector 47. Thus, by repeating this series of operations, an extracted clock synchronized in phase with the received data signal can be obtained.

BRIEF SUMMARY OF THE INVENTION

The first problem is a problem that the synchronization operation may not converge to induce oscillations in the conventional bit synchronization circuit, thereby leading to a deterioration in receiving characteristics.

The reason for this is that, since the extracted clock is fed back to the phase comparison circuit, the synchronization operation may not converge to induce oscillations and the most suitable extracted clock to received data is not selected in cases where the propagation delay time of a phase control signal (time taken for the phase comparison result to propagate to the clock selector) is greater than the time of a period in the phase comparison.

The second problem is a problem that the phase synchronism between a received data signal and the extracted clock may lose, thereby leading to a deterioration in receiving characteristics.

The reason for this is that the most suitable extracted clock to received data is not selected as follows. When a received data signal having a short-period phase variation such as jitter is inputted, the phase of the extracted clock also varies corresponding to a phase variation of the received data signal. However, since phase variations between the received data signal and the extracted clock have a time lag by the propagation delay time of a phase control signal, the phase synchronism between the received data signal and the extracted clock loses and consequently the most suitable extracted clock to received data is not selected.

It is one object of the present invention to provide a data synchronization circuit for performing a phase synchronization without use of a feedback loop configuration giving rise to oscillations and obtaining an extracted clock synchronized in phase even with a received data signal having a short-period phase variation such as jitter which improves in receiving characteristics so as to allow extracted data free from retiming error to be obtained.

According to the present invention, there is obtained a data synchronization circuit for extracting a clock synchronized with a received data from multi-phase clocks that are equal in frequency to the received data and successively shift in phase so as to subject the received data to retiming in accordance with this extracted clock, comprising phase comparing means for comparing the phase of the received data with that of each of the above multi-phase clocks to generate a specific signal for specifying one of the multi-phase clocks having a predetermined phase relation with the received data, retiming means for retiming the received data in accordance with the extracted clock, averaging means for averaging and outputting the specific signal in synchronism with an output of the retiming means, selective means for selectively extracting the multi-phase clocks in response to this averaged output and means for retiming the received data for derivation in accordance with the clock extracted by the selective means.

And, the above averaging means is featured by having retiming means for retiming the averaged output in accordance with the extracted clock to output it to the selective means.

Besides, the above phase comparing means comprises latch means for latching each of the multi-phase clocks in accordance with the received data and encoding means for encoding these latch outputs in accordance with a predetermined rule to make the specific signal.

The operation of the present invention will be stated. Since a configuration without a feedback of the extracted clock is implemented by achieving a phase synchronization with the aid of the phase compared result between a received data signal and multi-phased clocks, no oscillation performance occurs in the phase synchronization process.

Besides, by using the average of the phase compared results, the extracted clock and the extracted data are selectively outputted from the multi-phased clocks and the received data sampled by the multi-phased clocks, respectively, thereby enabling the extracted clock synchronized in phase to be outputted and the extracted data subjected to retiming without errors to be outputted even when received data signal having a phase synchronism such as zittr is inputted.

BRIEF DESCRIPTION OF THE DRAWINGS

FIG. 9 is a table showing the coding logic of an encoder 43;

FIG. 11 is a table showing the logic of a numerical value operation section 25;

DETAILED DESCRIPTION OF THE PREFERRED EMBODIMENTS

Figure 1:
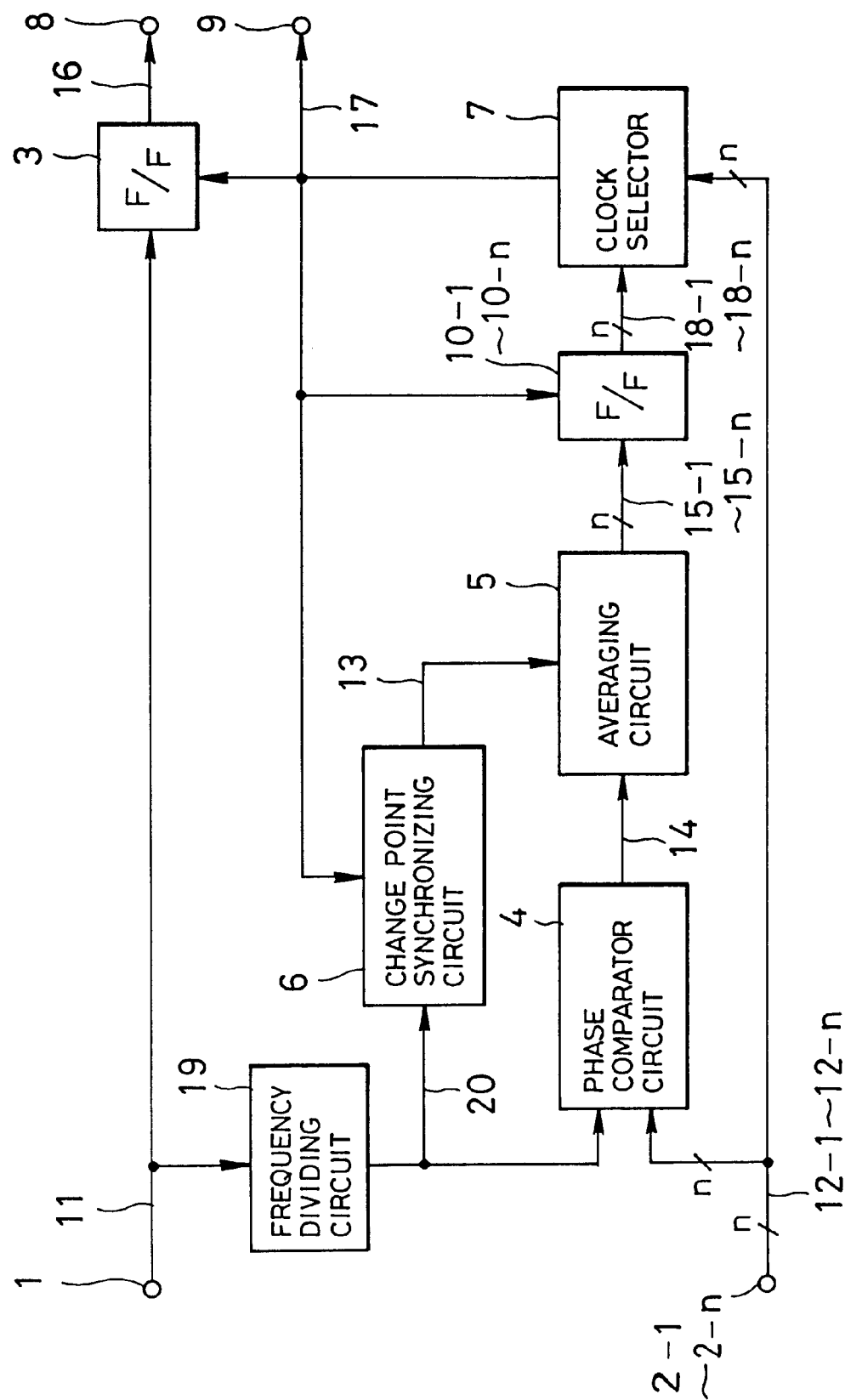
FIG. 1 is a block diagram showing one embodiment of the present invention.

Hereinafter, one embodiment of the present invention will be described in detail by referring to the drawings.

Figure 14:
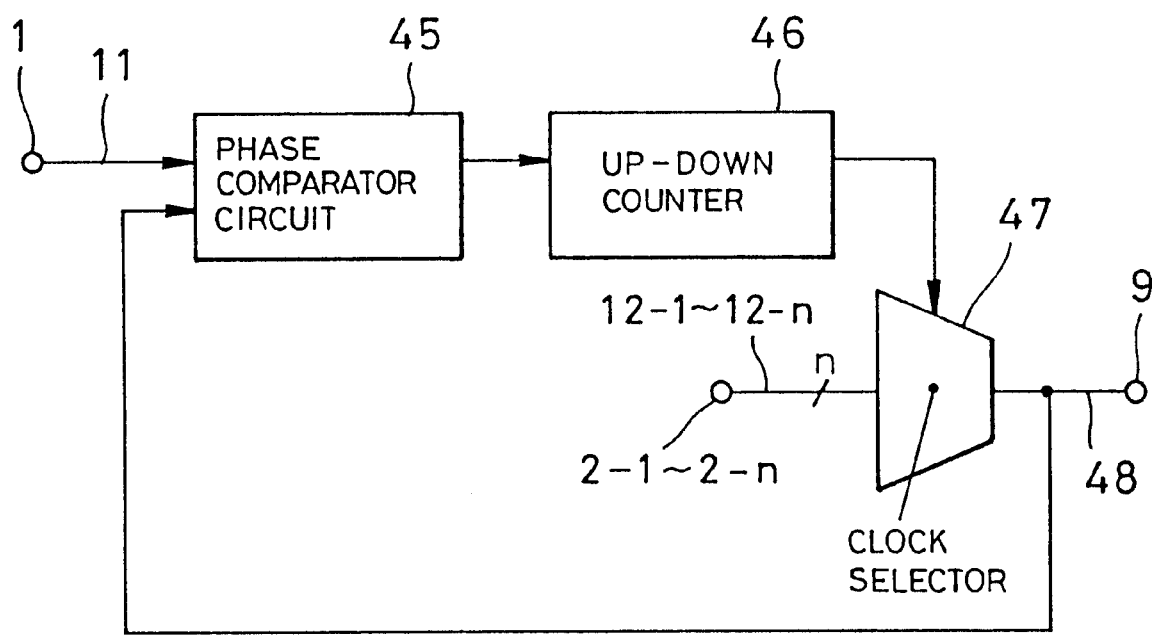
FIG. 14 is a block diagram showing the configuration example of conventional example of bit synchronization circuit.

FIG. 1 is a block diagram of one embodiment of the present invention. Parts similar to those of FIG. 14 are denoted by like symbols. The frequency divider circuit 19 divides the data 11 inputted from the input terminal 1 according to the frequency and outputs them as frequency divided data 20. The F/F (flip flop) 3 subjects the received data 11 to retiming in accordance with the extracted clock 17 selectively extracted by the clock selector 7 to lead out the identified data 16 to the output terminal 8.

The phase comparison circuit 4 compares the phase of the frequency divided data 20 with each phase of the n-phase clocks 12-1 to 12-n (n: integer equal to or greater than 2) and generates a specific signal 14 for specifying one of the n-phase clocks having a predetermined phase relation with the frequency divided data 20.

The averaging circuit 5 averages the specific signals 14 from the phase comparator circuit 4 in time series to generate averaged signals 15-1 to 15-n patterned. The change point synchronizing circuit 6 subjects the frequency divided data 20 to retiming in accordance with the extracted clock 17 and outputs them, by which the change point of the frequency divided data is synchronized in accordance with the extracted clock 17 and is outputted. In synchronism with this change point synchronized signal 13, the average processing of the averaging circuit 5 is so arranged as to be performed.

The F/F 10-1 to 10-n output each of n-bit averaged signals 15-1 to 15-n after the retiming in accordance with the extracted clock 17 and the clock selector 7 selects one of the n-phase clocks 12-1 to 12-n in response to these retimed averaged signals 18-1 to 18-n and leads out it as the extracted clock 17. This extracted clock 17 is not only outputted to the output terminal 9 but also serves as a clock input to F/F 3 for the identification of the received data 11.

Figure 6:
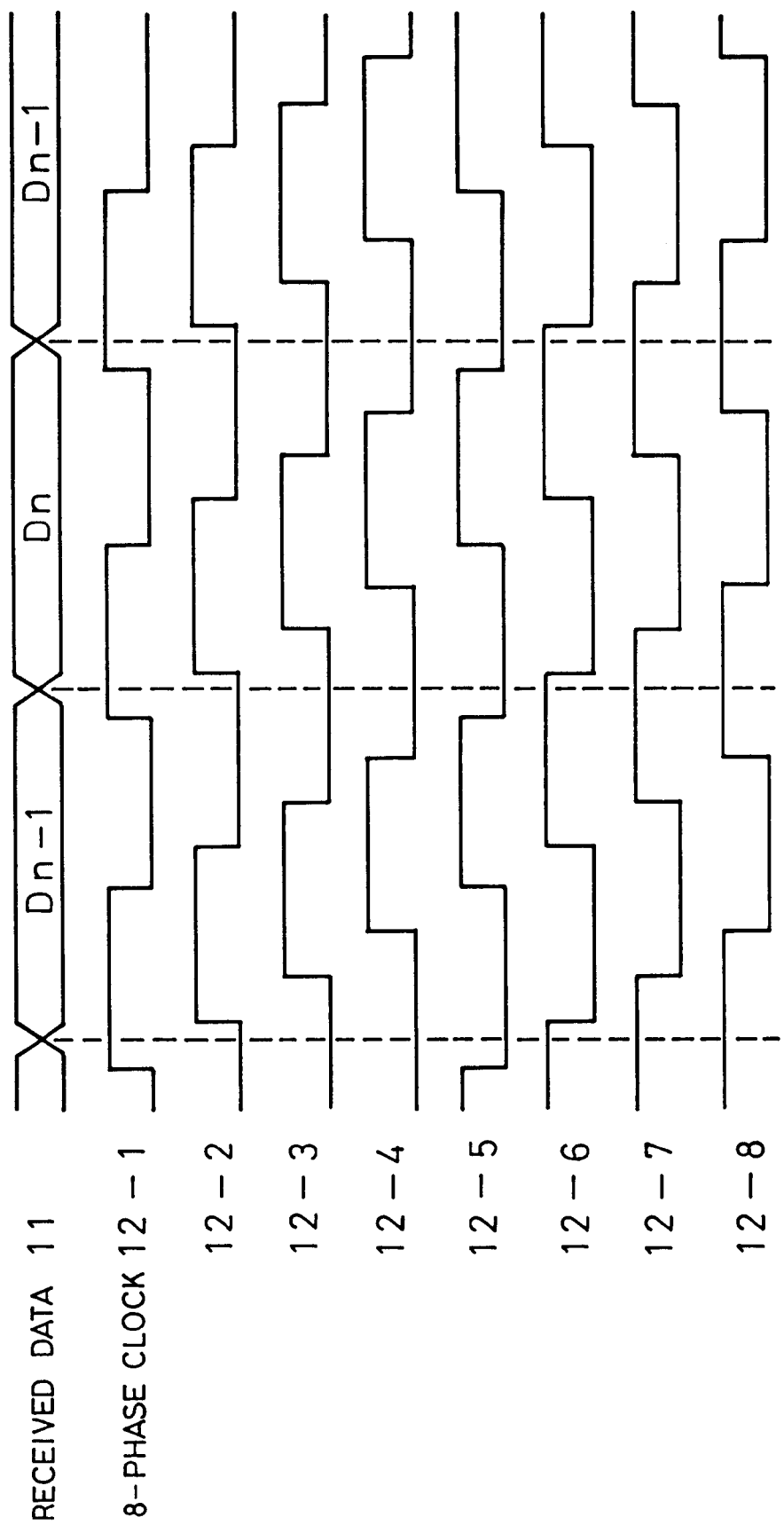
FIG. 6 is a time chart showing one example of n-phase clocks.

FIG. 6 shows the phase relation between the received data 11 and the 8-phase clocks 12-1 to 12-8 (n=8), while the 8-phase clocks are identical in frequency with the received data 11 and successively shift in phase by 360 deg./8 one from another.

Figure 7:
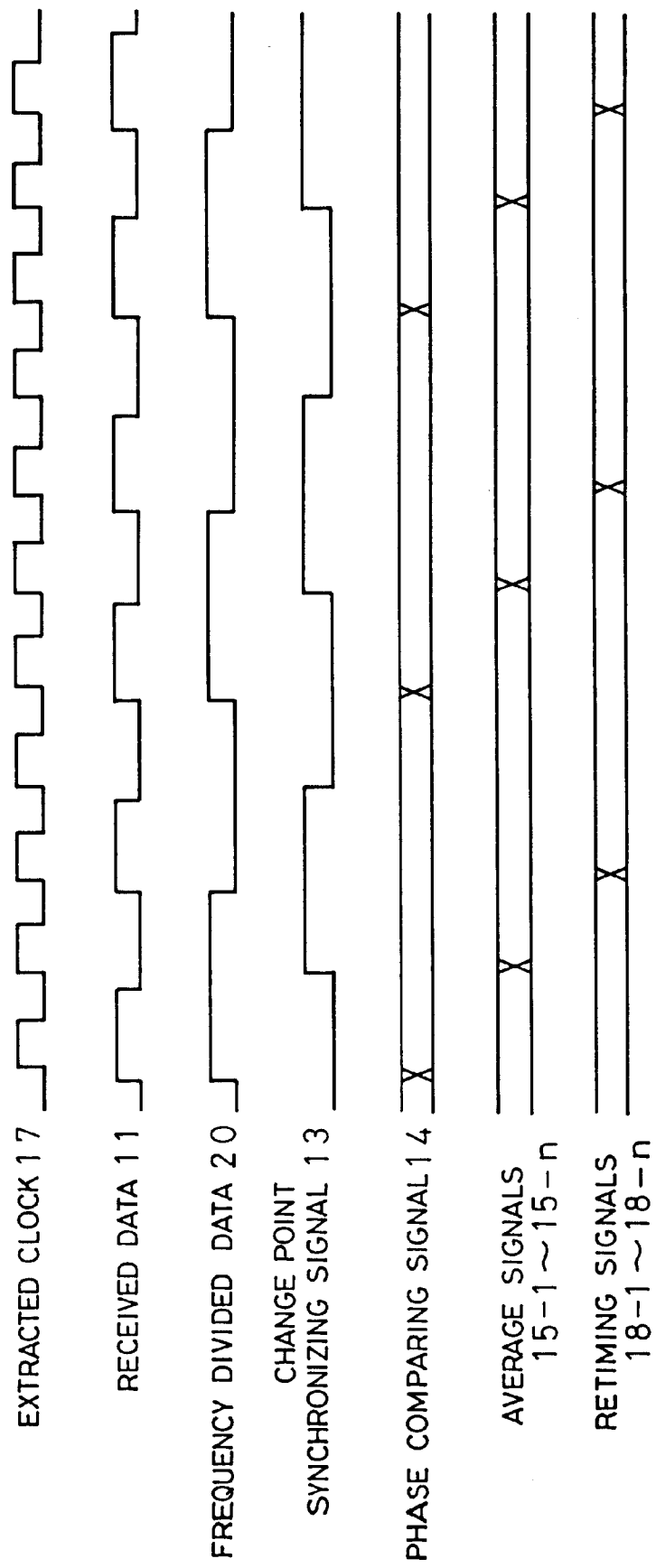
FIG. 7 is a time chart showing the operation of the embodiment of the present invention of FIG. 1.

Here at this time, to simplify the description, when the received data 11 are signals repeating changes between 0 and 1 every time as shown in FIG. 7 and assuming that the frequency dividing radio of the frequency divider circuit 19 is "½", the frequency divided data 20 are synchronized (retimed) with the rising edge of the extracted clock 17 and a change point synchronized signal 13 is generated.

Figure 2:
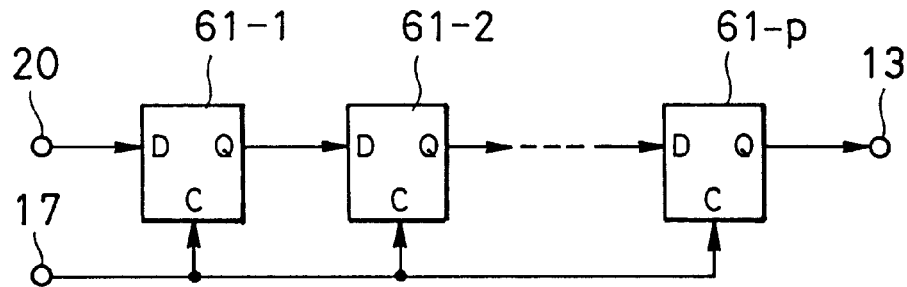
FIG. 2 is a block diagram showing a configuration example of change point synchronization circuit 6.

Incidentally, this change point synchronization detection circuit 6 is a cascade connection circuitry of p ("p" is an integer not greater than the frequency dividing ratio of the frequency dividing circuit 19) constituents F/F 61-1 to 61-p as shown in FIG. 2, where the frequency divided data 20 become a D input to the first step F/F 61-1, the Q output of this F/F 61-1 becomes a D input of the next step F/F 61-2. The further proceeds in a similar way and the Q output of the final step 61-p becomes the change point synchronized signal 13. To the clock (C) inputs of individual F/F is applied the extracted clock 17.

Incidentally, the frequency divided data 20 and the extracted clock 17 are asynchronous signals and in synchronism with the rising edge of the extracted clock 17 later than that of the frequency divided data 20, the change point synchronized signal 13 is obtained.

Figure 3:
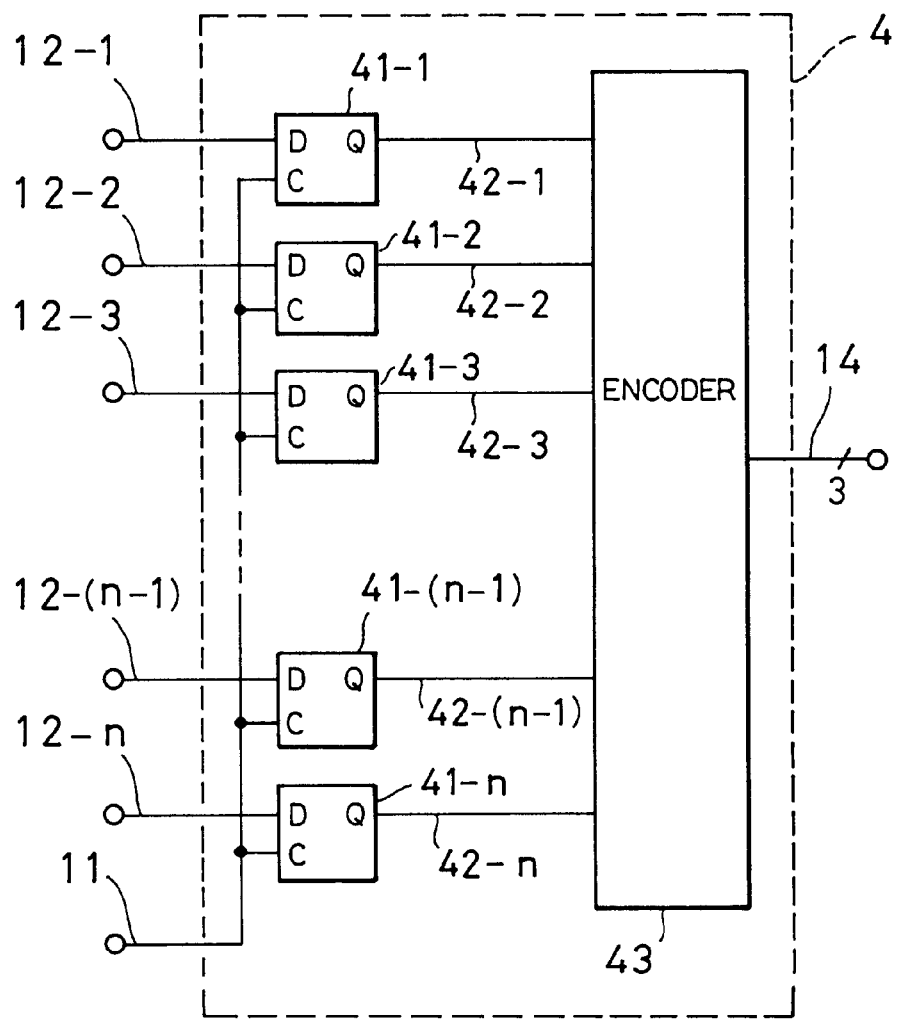
FIG. 3 is a block diagram showing a configuration example of phase comparator circuit 4.

FIG. 3 is a circuit diagram showing one example of phase comparator circuit 4. To the D inputs of the F/F 41-1 to 41-n are inputted n-phase clocks 12-1 to 12-n, respectively and to the clock (C) inputs thereof is inputted the received data 11 (when the frequency dividing ratio is 1, generally their frequency divided data 20).

Q outputs 42-1 to 42-n of individual F/F 41-1 to 41-n are inputted to the encoder 43 and encoded as the closest clock phase information (phase information for specifying one of the n-phase clocks) 14 to the change point phase of the received data 11.

Figure 8:
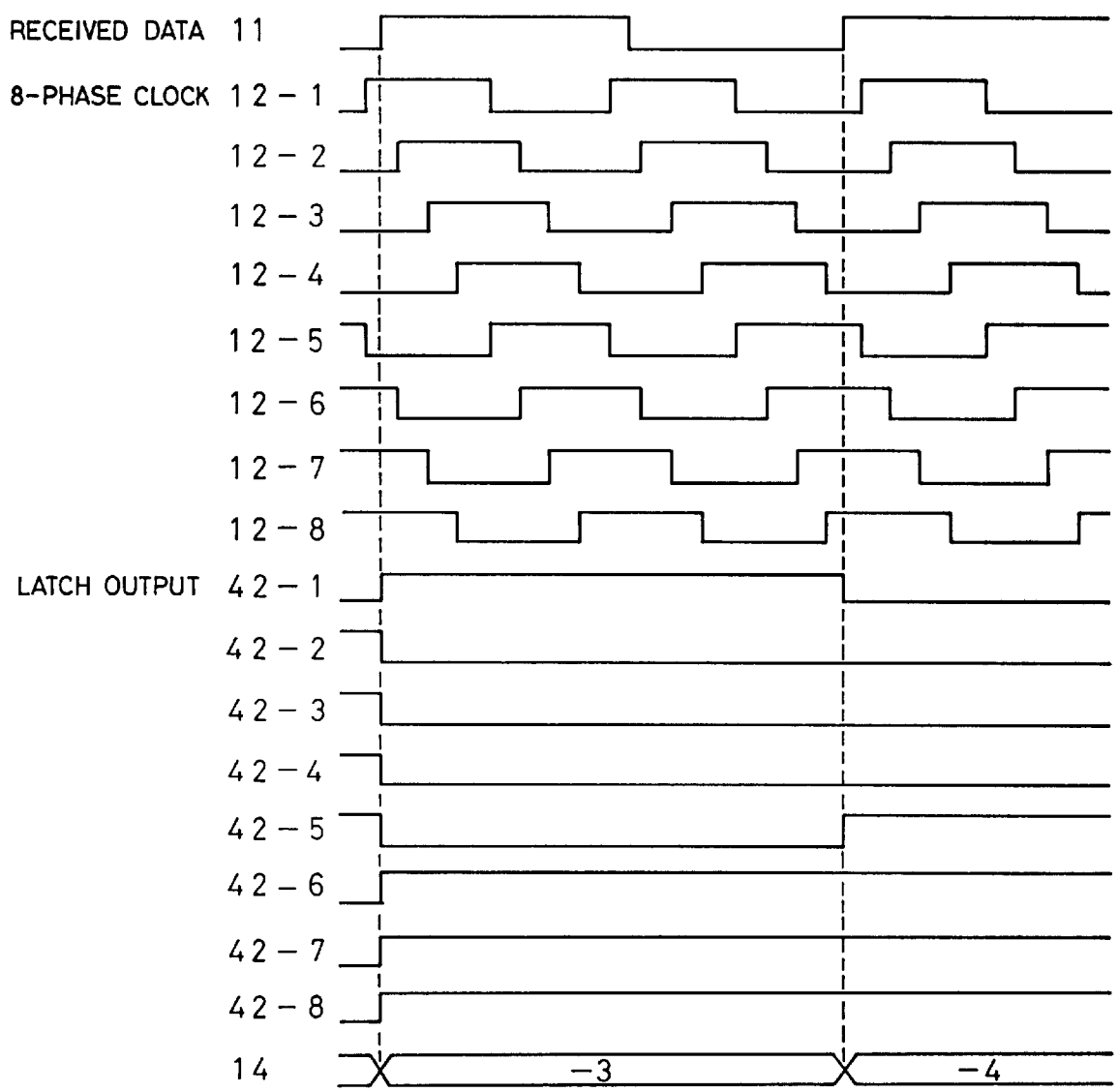
FIG. 8 is a time chart showing the operation of phase comparator circuit 4.

FIG. 8 is a time chart showing the operation of the phase comparator circuit 4 in FIG. 3. By latching the 8-phase clocks 12-1 to 12-8 inputted to the F/F 41-1 to 41-8 (n=8) with the rising edge of the received data 11, output data 42-1 to 42-8 are obtained. These latch outputs 42-1 to 42-8 are encoded into a phase comparing signal 14 by the encoder 43. The encode logic of this encoder 43 is shown in FIG. 9.

For values of phase comparing signals 14 outputted from the encoder 43, a one-to-one correspondence is previously established to 8 types of 8-phase clocks 12-1 to 12-8, respectively in terms of 3-bit expressions ("000" to "111"). If the rising edge of the received data 11 lies between the that of an 8-phase clock 12-1 and that of an 8-phase clock 12-2 as shown in FIG. 8, values of the output data 42-1 to 42-8 become "10000111". A value of phase comparison signal 14 at this time is found from FIG. 9 to become "−3" and consequently the 8-phase clock 12-6 is specified.

Besides, if the rising edge of the received data 11 lies between the that of an 8-phase clock 12-8 and that of an 8-phase clock 12-1, values of the output data 42-1 to 42-8 become "00001111". A value of phase comparison signal 14 at this time is found from FIG. 9 to become "−4" and consequently the 8-phase clock 12-5 is specified.

Figure 4:
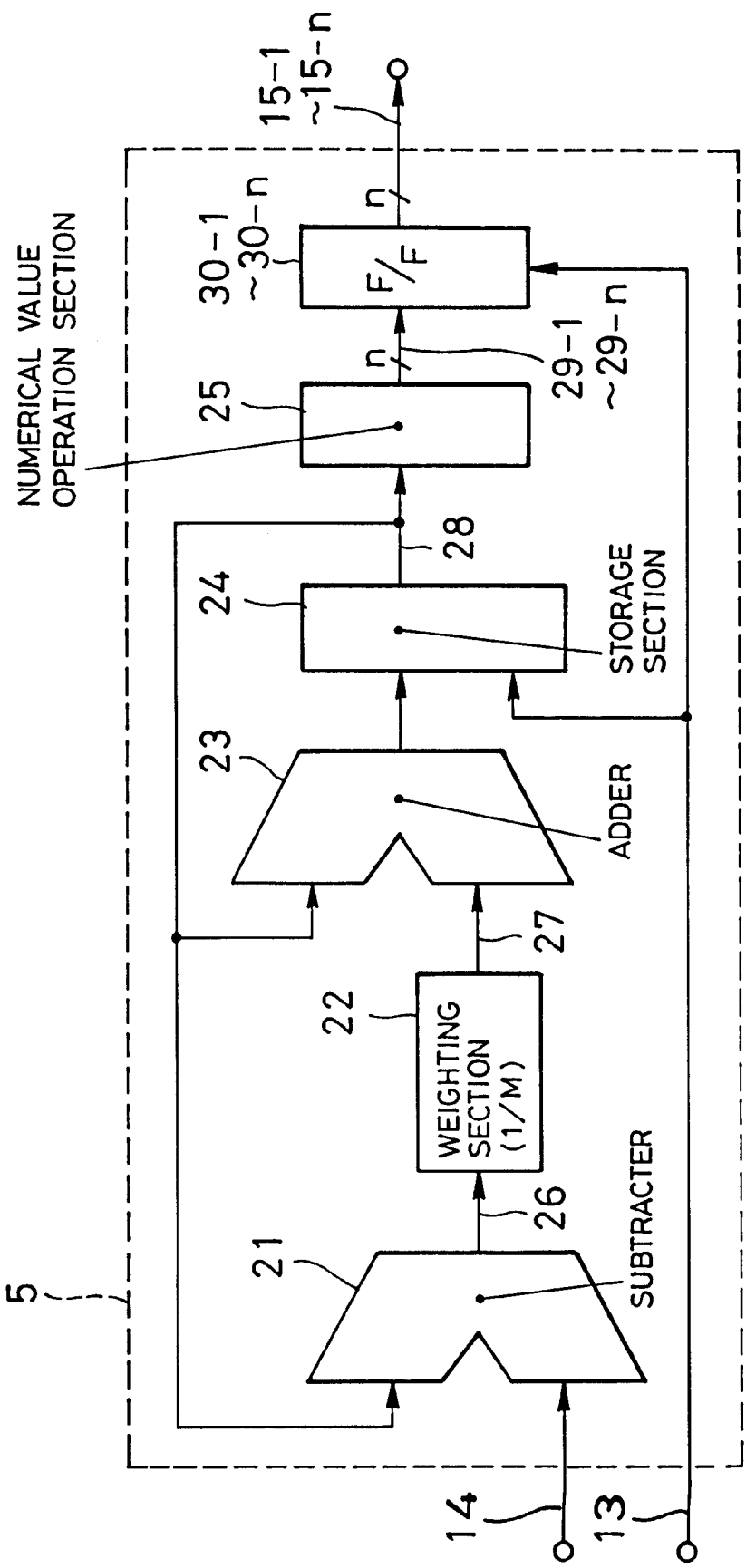
FIG. 4 is a block diagram showing a configuration example of averaging circuit 5.

FIG. 4 shows the circuitry of one embodiment of averaging circuit 5 shown in FIG. 1. The phase comparison signal 14 of the phase comparator circuit 4 is inputted to the minuend signal input of the subtracter 21. The storage section 24 inputs the change point synchronized signal 13 as a clock signal and retains the status of addition operation result from the adder 23 to output it to the numerical operation section 25.

The subtracter 21 outputs the subtracted result obtained by subtracting the output value 28 of the storage section 24 from a phase comparison signal 14 to the 1/m weighting section 22. The 1/m weighting section 22 performs a 1/m remainder operation and outputs the remainder operation result to the adder 23. The adder 23 performs an addition operation of the remainder result from the 1/m weighting section 22 to an output value 28 of the storage section 24 and outputs the corrected average value to the storage section 24. The numerical value operation section 25 rounds an output value 28 of the storage section 24 to an integer and obtains the averages 29-1 to 29-N of phase comparison signals. These average values 29-1 to 29-N are retimed by the F/F 30-1 to 30-n in accordance with the change point synchronized signal 13 and the averaged signals 15-1 to 15-n are outputted.

Figure 10:
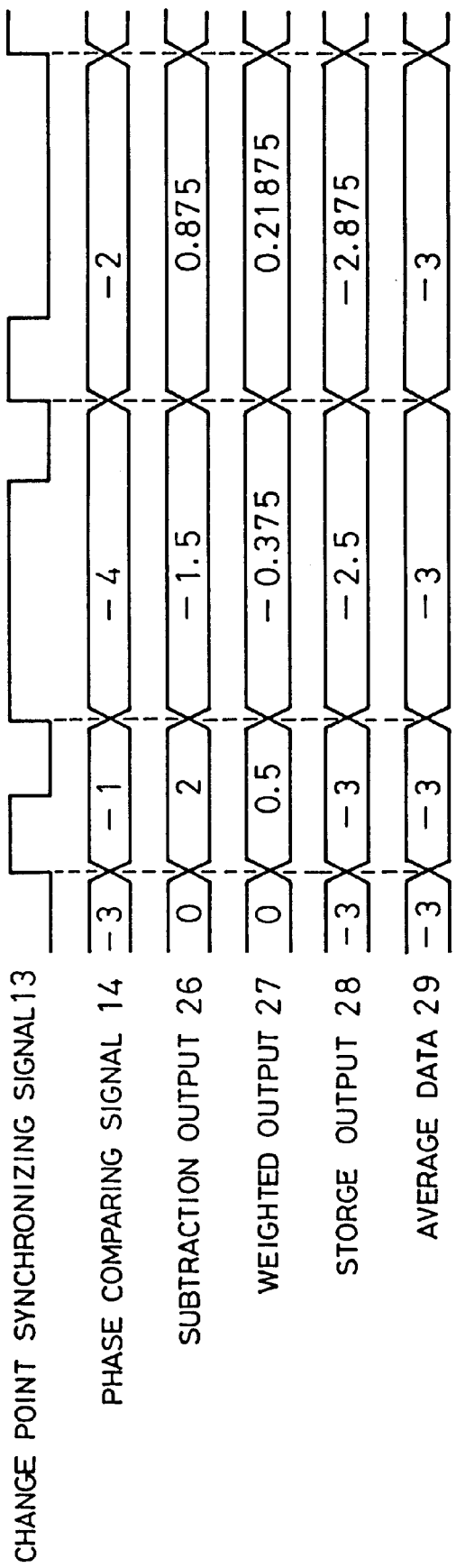
FIG. 10 is a time chart showing the operation of an averaging circuit 5.

FIG. 10 is a time chart showing the operation of the averaging circuit of FIG. 4 at n=8 and m=4.

The difference of the inputted phase comparison signal 14 from the value retained by the storage section 24 is taken, weighted with ¼ and added to the value retained by the storage section 24 for each rising phase of the change point synchronized signal 13. As a result, the averages of phase comparison signals are evaluated and are outputted as averaged signals 15-1 to 15-8 after values of the storage section 24 are rounded off in the numerical value operation section 25. FIG. 11 shows the logic of an input signal 28 and the output signals 29-1 to 29-8 of the numerical value operation section 25.

Figure 5:
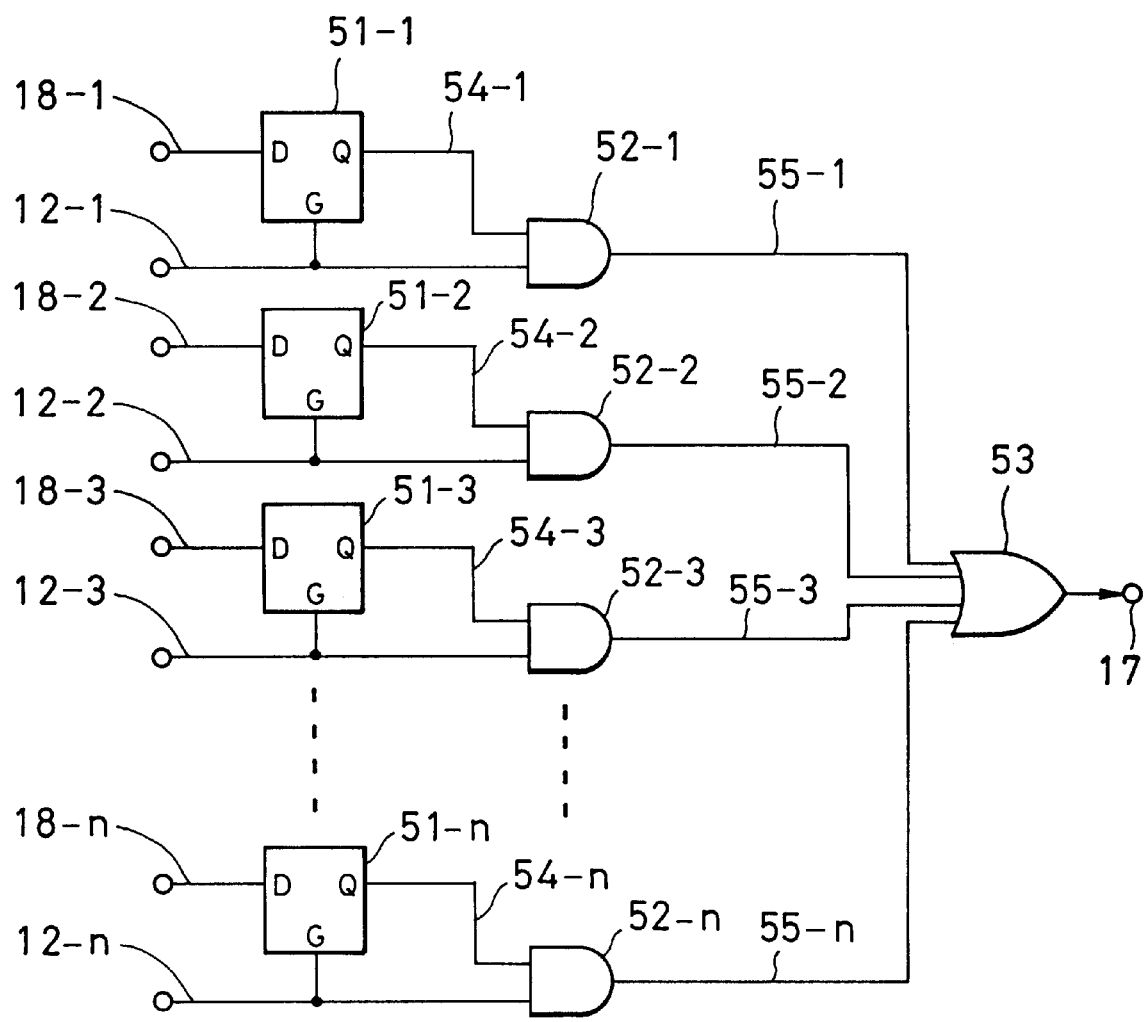
FIG. 5 is a block diagram showing a configuration example of clock selector 7.

FIG. 5 shows the circuitry of one embodiment of clock selector 7 shown in FIG. 1. Individual retimed signals 18-1 to 18-n of the averaged signals 15-1 to 15-n are inputted to the latch circuits 51-1 to 51-n and outputs 54-1 to 54-n latched with n-phase clock signals 12-1 to 12-n are inputted to one input of 2-input AND circuits 52-1 to 52-n. Inputted to the other input of 2-input AND circuits 52-1 to 52-n are n-phase clock signals 12-1 to 12-n and output signals 55-1 to 55-n are inputted to the n-input OR circuit 53. The n-input OR circuit 53 outputs an extracted clock signal 17.

Figure 12:
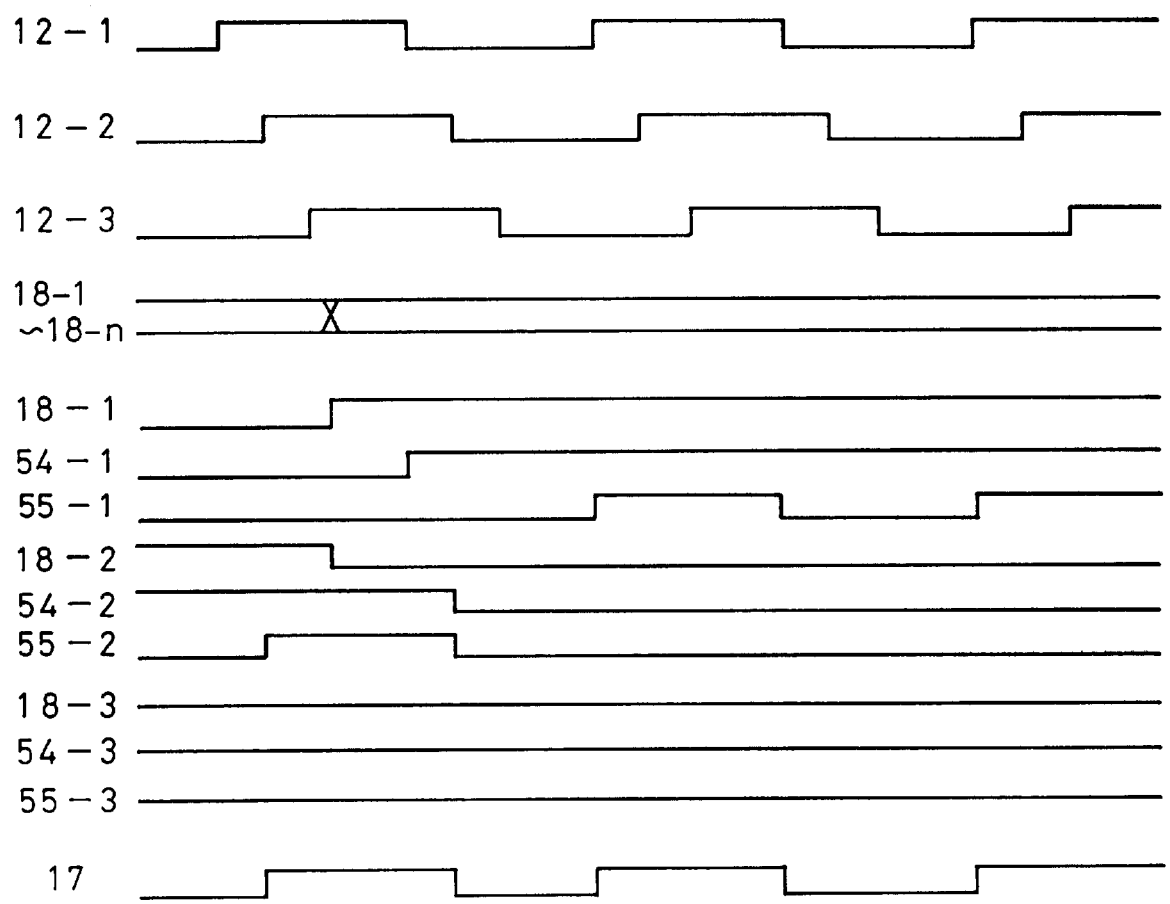
FIG. 12 is a time chart showing one example of clock selector 7.
Figure 13:
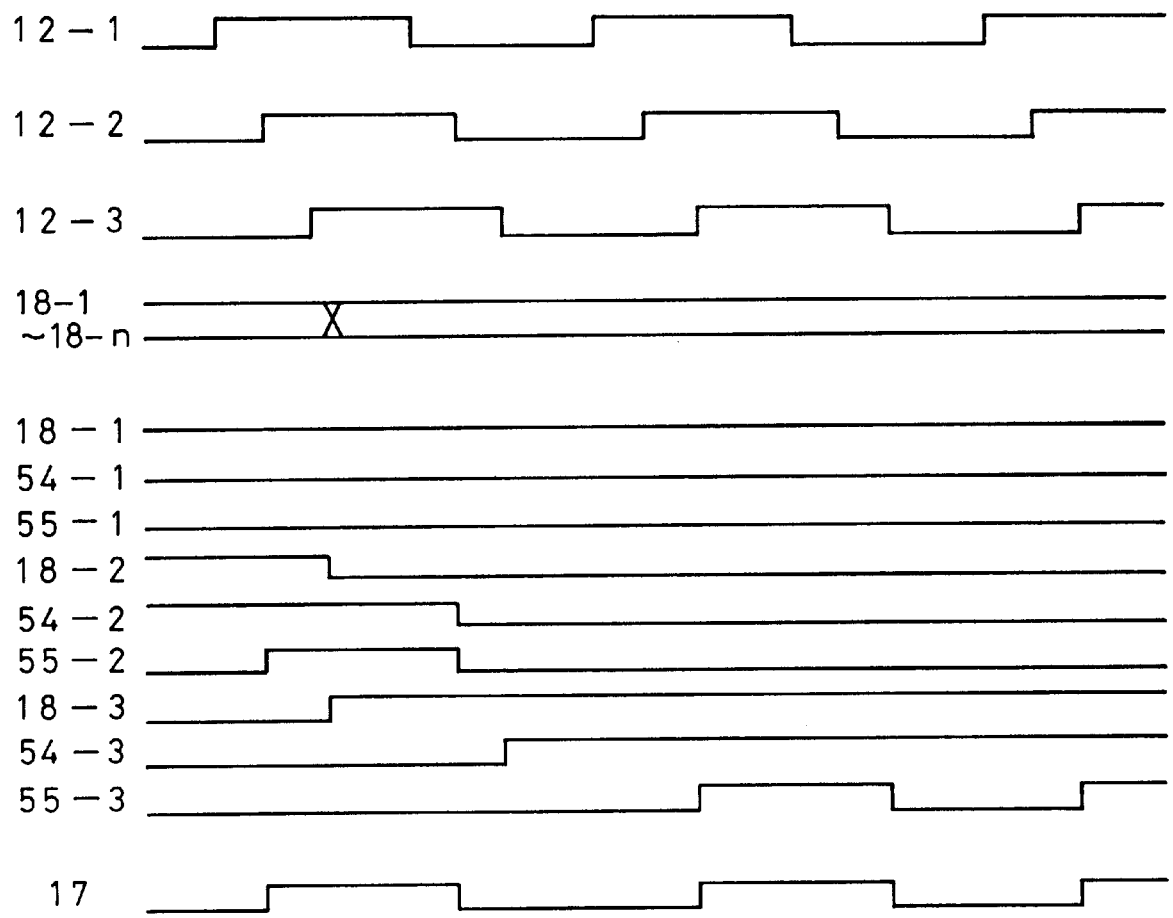
FIG. 13 is a time chart showing another example of clock selector 7.

FIGS. 12 and 13 are time charts showing the operation of the clock selector 7 in FIG. 5. Generally in a circuit for selecting clocks, care should be taken so that no impulse noise appears at the switching time of selection and this circuit satisfies this demand.

FIG. 12 shows the process transmitting from the state of the clock 12-2 being selected by the selector in FIG. 5 to that of the clock 12-1 being selected. In the state of the clock 12-2 being selected, the selection signals 18-1 to 18-n take a value of 1 only for 18-2 and a value of 0 for others. The new selection signals 18-1 to 18-n are inputted after a lag from the rising edge of the clock 12-2 and they take a value of 1 only for 18-1 and a value of 0 for others.

The latch circuits 51-1 to 51-n in FIG. 5 are in the sample state for a latch signal of 0 and in the hold state for a latch signal of 1. Thus, the latch outputs 54-1 and 54-2 are retained till the rise of the n-phase clock signals 12-1 and 12-2.

The outputs 55-1 and 55-2 of the 2-input AND circuits become respectively as shown in FIG. 12 and the extracted clock 17 of output of the n-input OR circuit ends in switching from 12-2 to 12-1 of the n-phase clocks.

As with FIG. 12, FIG. 13 shows the process of transition from the state of the clock 12-2 being selected by the selector to that of the clock 12-3 being selected. Both in the case of FIG. 12 and in the case of FIG. 13, it is shown that switching takes place without appearance of a impulse noise in the extracted clock 17.

According to the second embodiment of the present invention, it is also allowable to omit the F/F 10-1 to 10-n in FIG. 1 and employ the averaged signals 15-1 to 15-n directly as the selected signals of the clock selector 7. As faults of this case, it may be mentioned that the clock selector 7 becomes too critical in operation to operate at high speed.

According to the third embodiment, it is also allowable to omit the frequency divider circuits 19 in FIG. 1 and employ the received data 11 as the frequency divided data 20. As faults also in this case, the averaging circuit 5 or the like becomes too critical in operation to operate at high speed.

According to the fourth embodiment, it is also allowable to replace an AND or OR circuit in FIG. 5 with a NAND circuit.

As described above, since a configuration without a feedback of the extracted clock is implemented by achieving a phase synchronization with the aid of the phase compared result between a received data signal and multi-phase clocks, no oscillation performance occurs in the phase synchronization process.

Besides, using the average of the phase compared results to selectively output the extracted clock and the extracted data from a multi-phased clock and received data sampled in accordance with the multi-phased clock, would bring about an effect as enables the extracted clock synchronized in phase to be outputted and the extracted data retimed without errors to be outputted even when the received data having a phase variation such as jitter are inputted.

What is claimed is:

1. A data synchronization circuit for extracting a clock synchronized with a received data from multi-phase clocks that are equal in frequency to the received data and successively shifted in phase so as to subject the received data to retiming in accordance with this extracted clock, comprising:

phase comparing means for comparing the phase of said received data with that of each of said multi-phase clocks to generate a specific signal for specifying one of the multi-phase clocks having a predetermined phase relation with the received data;

retiming means for retiming said received data in accordance with the extracted clock;

averaging means for averaging and outputting the specific signal in synchronism with an output of said retiming means;

selective means for selectively extracting the multi-phase clocks in response to this averaged output; and means for retiming said received data in accordance with the clock extracted by said selective means.

2. A data synchronization circuit as set forth in claim 1, wherein said averaging means has retiming means for retiming the averaged output in accordance with the extracted clock to output it to said selective means.

3. A data synchronization circuit as set forth in claim 1, wherein said phase comparing means comprises latch means for latching each of the multi-phase clocks in accordance with the received data and encoding means for encoding these latch outputs in accordance with a predetermined rule to make the specific signal.

4. A data synchronization circuit as set forth in claim 1, wherein said multi-phase clock is an n-phase clock having individual phases which successively shift from each other by 360 deg./n (n: integer equal to or greater than 2).

5. A data synchronization circuit as set forth in claim 4, wherein said averaging means is to calculate a time-series average of said specific signals.

6. A data synchronization circuit as set forth in claim 5, wherein said selective means comprises:

n latch means;

each of said latch means for latching each bit of a code pattern showing the output of said averaging means in accordance with each of said multi-phase clocks, n AND circuits;

each of said AND circuits having an input terminal inputted each of outputs of said latch means and the other terminal inputted each of said multi-phase clocks, an OR circuit having n input terminals inputted outputs of said n AND circuits, wherein said extracted clock is led out from said OR circuit.

7. A data synchronization circuit as set forth in claim 5, wherein said elective means comprises:

n latch means;

each of said latch means for latching each bit of a code pattern showing the output of said averaging means in accordance with each of said multi-phase clocks, n NAND circuits;

each of said NAND circuits having an input terminal inputted each of outputs of said latch means and the other terminal inputted each of said multi-phase clocks, an OR circuit having n input terminals inputted outputs of said n NAND circuits, wherein said extracted clock is led from said OR circuit.

8. A data synchronization circuit for extracting a clock synchronized with a received data from multi-phase clocks that are equal in frequency to the received data and successively shift in phase so as to subject the received data to retiming in accordance with this extracted clock, comprising:

frequency dividing means for dividing said received data according to the frequency;

phase comparing means for comparing the phase of the frequency divided output of said frequency dividing means with that of each of said multi-phase clocks to generate a specific signal for specifying one of the multi-phase clocks having a predetermined phase relation with the frequency divided data;

retiming means for subjecting said frequency divided output to retiming in accordance with the extracted clock;

averaging means for averaging and outputting the specific signal in synchronism with an output of said retiming means;

selective means for selectively extracting the multi-phase clocks in response to this averaged output; and means for retiming said received data to lead-out in accordance with the clock extracted by said selective means.

9. A data synchronization circuit as set forth in claim 8, wherein said phase comparing means comprises latch means for latching each of the multi-phase clocks in accordance with the frequency divided output and encoding means for encoding these latch outputs in accordance with a predetermined rule to make the specific signal.

* * * * *